United States Patent [19]

Bhattacharya et al.

[11] Patent Number: 4,782,458

[45] Date of Patent: Nov. 1, 1988

[54] ARCHITECTURE FOR POWER OF TWO COEFFICIENT FIR FILTER

[75] Inventors: Arup K. Bhattacharya, Peekskill; Michael G. Cristofalo, Pleasantville; David Koo, Briarcliff Manor; Amihai Miron, Ossining; Imran A. Shah, North White Plains, all of N.Y.

[73] Assignee: North American Philips Corporation, New York, N.Y.

[21] Appl. No.: 944,295

[22] Filed: Dec. 18, 1986

[51] Int. Cl.[4] ............................................. G06F 15/31
[52] U.S. Cl. ............................................. 364/724.16
[58] Field of Search ............ 364/724; 333/28 R, 168; 375/11, 12, 14

[56] References Cited

U.S. PATENT DOCUMENTS

| | | | |
|---|---|---|---|
| 3,860,892 | 1/1975 | Speiser et al. | 333/28 R X |
| 3,979,701 | 9/1976 | Tomozawa | 364/825 X |
| 4,322,810 | 3/1982 | Nakayama | 364/724 |
| 4,356,558 | 10/1982 | Owen et al. | 364/724 |
| 4,507,725 | 3/1985 | Christopher et al. | 364/724 |
| 4,524,423 | 6/1985 | Acampora | 364/724 |
| 4,700,345 | 10/1987 | Morcom et al. | 364/724 X |

Primary Examiner—Gary V. Harkcom
Assistant Examiner—Tan V. Mai
Attorney, Agent, or Firm—James J. Cannon

[57] ABSTRACT

An architecture for a very large scale integrated (VLSI) implementation of a finite imprise response (FIR) digital filter having no multipliers and a coefficient space limited to powers of two. The filter structure includes a data bus, a coefficient bus and a sum-in bus to each coefficient tap. Each tap has a coefficient and control word register which is loaded during an initialization phase of the filter. Multiplication is provided by a shifter which provides the correct power of two weighting of an input data sample. The weighted data sample at each tap is added to the output of the previous tap. This architecture results in a regular, modular structure which can be cascaded and which is programmable for various data word lengths and coefficient spaces.

16 Claims, 7 Drawing Sheets

ZERO COEFF.
SIGN OF COEFF.
VALUE OF THE POWER OF COEFF.

FIG.4B

| VALUE OF COEFF. | MULTIPLIED VALUE |
|---|---|
| $2^0$ | S\|7 6 5 4 3 2 1 0\|Z Z Z Z Z Z |
| $2^{-1}$ | S Z\|7 6 5 4 3 2 1 0\|Z Z Z Z Z |
| $2^{-2}$ | S Z Z\|7 6 5 4 3 2 1 0\|Z Z Z Z |
| $2^{-3}$ | S Z Z Z\|7 6 5 4 3 2 1 0\|Z Z Z |
| $2^{-4}$ | S Z Z Z Z\|7 6 5 4 3 2 1 0\|Z Z |
| $2^{-5}$ | S Z Z Z Z Z\|7 6 5 4 3 2 1 0\|Z Z |
| $2^{-6}$ | S Z Z Z Z Z Z\|7 6 5 4 3 2 1 0\|Z |
| $2^{-7}$ | S Z Z Z Z Z Z Z\|7 6 5 4 3 2 1 0\| |

FOR POSITIVE COEFFICIENTS

ARCHITECTURE FOR POWER OF TWO COEFFICIENT FIR FILTER

CROSS REFERENCE TO RELATED APPLICATION

This application is related to pending application Ser. No. 923,534, filed Oct. 27, 1986, entitled A MULTIPLIERLESS FIR DIGITAL FILTER WITH TWO TO THE NTH POWER COEFFICIENTS, Amihai Miron and David Koo, inventors, assigned to the assignee of the present application and which is incorporated herein by reference as background information.

BACKGROUND OF THE INVENTION

1. Field of the Invention

This invention pertains to the field of non-recursive digital filters used for digital signal processing and real time digital video processing. In particular it pertains to an architectural realization, in the form of very large scale integrated (VLSI) circuits, of finite impulse response (FIR) filters which do not require multipliers and which have only coefficients of two to the Nth power.

2. Description of the Prior Art

Among the different types of digital filters there has been a great deal of interest in finite impulse response (FIR) digital filters (also called traversal filter). The reason for this is that powerful and mature optimization theories exist to aid in the filter design. FIR filters can easily be designed to approximate a prescribed magnitude/frequency response to arbitrary accuracy with an exactly linear phase characteristic. The non-recursive FIR filters contain only zeroes in the finite z-plane and hence are always stable. These features make them very attractive for most digital signal processing applications.

Finite impulse response (FIR) digital filters are widely used in digital signal processing, as well as in real-time digital video processing. The conventional hardware realization of an FIR digital filter utilizes the basic functional components of delay units, multipliers and adders. Among these basic functional components, multipliers are generally the most complex for hardware realization, and occupy large "real estate" area, which increases the cost of the filter. The cost of multipliers in discrete component systems is high. From the point of view of VLSI chip design, the area occupied by a multiplier on an IC filter chip is too large. Cost is not the only important factor; but the operational speed of a filter is even more significant in a variety of applications; for example, in real-time video processing and other high speed digital signal processing. In the conventional FIR digital filter, a high percentage of the propagation delay time is due to multipliers, which reduce the speed of the filter. Therefore, to improve the operational speed, reduce the cost and simplify the structural complexity for VLSI chip design, it is desirable to eliminate time-consuming multipliers from digital FIR filters.

Current technical literature includes numerous articles directed toward the reduction or elimination of multipliers in the architecture or design of FIR digital filters, while at the same time proposing solutions directed to increasing the speed of these filters for use in real time digital signal processing applications.

In the prior patent art, U.S. Pat. No. 3,979,701 discloses a non-recursive digital filter composed of a cascaded plurality of basic sections, each of which is characterized by coefficient values of integer powers of two's. The filter of this patent uses no multipliers and claims an operating speed several times faster than other filters which utilize multipliers.

The multiplierless FIR filter disclosed in this application has certain concepts which appear to be similar to those of U.S. Pat. No. 3,979,701 but there are important differences.

The filter described in U.S. Pat. No. 3,979,701 has two basic building blocks from which the filter is constructed: Type 1 and Type 2. The Type 1 unit has only coefficients with a value of 1 (see line 53 to line 56 of column 3 of U.S. Pat. No. 3,979,701); the Type 2 unit has only an even number of delay elements and only three coefficients, the center coefficient value of which is always equal to 1 (see line 7 to line 12 of column 4 of U.S. Pat. No. 3,979,701).

SUMMARY OF THE INVENTION

The invention pertains to the architecture and VLSI implementation of an FIR digital filter which contains no multipliers and in which the coefficient space is limited to only powers of two. In conventional digital filter design, the filter coefficients are linearly quantized to two to the Nth power different levels. In multiplier-free digital filter design, the filter coefficients are non-linearly quantized to N different levels, each one of which represents a number equal to two to the Nth power. Multipliers may be replaced by shift registers and/or multiplexers in this non-conventional design.

The FIR filter architecture of the present invention uses a structure that is regular and modular. It utilizes for each tap a structure in which three buses go into each tap, the data bus, the coefficient bus and the sum-in bus. The data bus brings the broadcast data sample to each tap. The coefficient bus contains the weighting factor information. The sum-in bus brings the delayed output of the previous tap. Going out of each tap is the sum-out bus, which is the output of each tap and which goes to the sum-in input of the next tap. This regular, modular architecture lends itself to cascading of filter sections for larger filters.

Each tap has a coefficient register which contains the coefficient and control word information for that tap. This information is loaded in the initialization phase of the filter operation. Each tap has a shifter which uses the coefficient for the correct power of two weighting. The output of the shifter is the weighted data sample which is latched in a pipelining latch. The output of the latch is added to the output of the previous tap by an adder. The adder's output is delayed by one time unit and then passed on as the adder input of the next tap.

The filter works in two phases, the initialization phase and the normal operation phase. In the initialization phase, the coefficients and control words are loaded for each tap. The coefficient registers are shift registers connected in a serial chain and the loading thereof is serial. A non-destructive verification of the loading is accomplished by reading out serially the coefficients and control words and reloading them back in a closed loop simultaneously so that at the end of the verification procedure all coefficients and control words reside in the correct registers.

This filter uses only powers of two as coefficients. As binary multiplication by powers of two is nothing but a shift of the multiplicand, complex multiplication is replaced by a simple shifter in this case. With the use of only negative powers of two as coefficients, the shift operation is simplified to only right shift. Assuming the data (multiplicand) is always positive this shifter can handle both positive and negative coefficients. For the example described and illustrated, the output of this multiplier is one's complement 16 bit data words with the most significant bit as sign bit and fifteen magnitude bits, hence enabling the provision of a maximum seven bit shift for an eight bit multiplicand, which is equivalent to a multiplication by $2^{-7}$. This is the most negative power of two which such a multiplier can handle. Thus, properly programmed it can multiply the multiplicand with any one of the following values $$0, \pm 2^0, \pm 2^{-1}, \pm 2^{-2}, \ldots, \pm 2^{-7}.$$

However, this limitation can be overcome by an expansion of the coefficient space. The power-of-two coefficient space can easily be extended beyond the current limit of $\pm 2^{-7}$ by modifying the shifter and certain other elements which handle its output. The overall architecture of the shifter would not change; but only would extended to include the increase of coefficient space.

Similarly, the architecture is not limited to data words of 8 bits. To handle longer data words of any arbitrary size all that is needed is an increase of the size of the NAND gate sets in the shifter from 8 to whatever the data size desired is. Obviously, the ADDER size will have to be increased or decreased according to the maximum value of both the coefficient space and data word size.

The proposed FIR filter structure is fully programmable for a coefficient space C such that:

$$[C \epsilon \{0, \pm 2^0, \pm 2^{-1}, \pm 2^{-2}, \ldots, \pm 2^{-7}\}].$$

To maintain programmability of the filter, all possible shifts of the data inputs are provided for, using a multiplexer whose input is the output of sets of NAND gates, having positive inputs and a selection line. Outputs of the NAND gates are shifted and hard-wired to the multiplexer. The one's complement conversion of the multiplexer output is accomplished by a set of EX-OR gates. Thus, using a shifter and a decoder, NAND gates and EX-OR gates, the filter multiplies a coefficient by a data word without a standard multiplier.

The filter has been successfully simulated using various coefficients and random data.

DESCRIPTION OF THE PREFERRED EMBODIMENT

Filtering is one of the most important functions of real time linear signal processing. Among the different types of digital filters there has been a great deal of interest in finite impulse response (FIR) digital filters (also called transversal filter). The reason for this is that powerful and mature optimization theories exist to aid in the filter design. FIR filters can easily be designed to approximate a prescribed magnitude/frequency response to arbitrary accuracy with an exactly linear phase characteristic. The non-recursive FIR filters contain only zeroes in the finite z-plane and hence are always stable. These features make them very attractive for most digital signal processing applications.

The FIR filter is characterized by the input/output relation $$Y_n = \sum_{i=0}^{N-1} C_i X_{n-i} \tag{1}$$

where $X_{n-i} = X(t_n - iT_s)$ is the sampled input signal and $Y = Y(t_n)$ is the corresponding output signal. $T_s$ is the sampling period, $t_n = nT_s$ are sample instances and $f_s = 1/T_s$ is the sample rate. So each output sample is the weighted sum of a finite number of input samples (N in Eq. 1).

Figure 1:
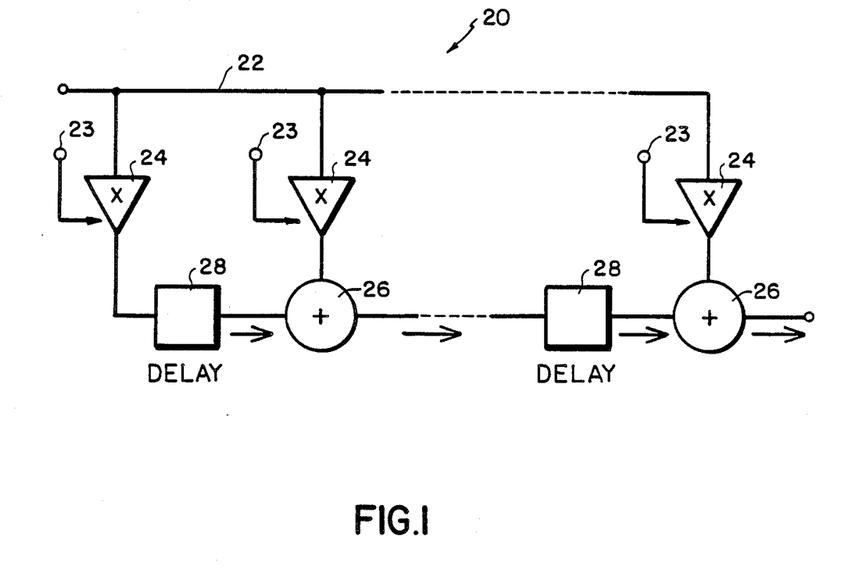
FIG. 1 is a block diagram of the classic realization of an FIR filter.

The classical realization of Eq. 1 is illustrated in FIG. 1, showing the well known semi-systolic parallel-in serial-out transversal filter architecture 20, in which the weighting of the input samples is accomplished by multipliers. The data is broadcast via a data bus 22 globally to every tap in the filter, where it is multiplied in multiplier 24 by a weighting factor (the coefficient) from a coefficient register (not shown) appearing on input 23 and then added in adder 26 to a delayed output from delay 28 of the previous tap. Thus, the basic building blocks of transversal filter 20 are the multiplier 24, the adder 26 and the delay 28. The multiplier is the most time consuming and expensive building block of the filter, thus there has been a great effort to make multiplication operation cheaper and faster, to increase the overall speed of operation of the filter. It is this weighting factor multiplier that is eliminated in the filter architecture of the invention.

If the coefficient space is limited to only power of two, then the complex multiplication can be altogether replaced by a simple shift operation. This is the main feature of the FIR filter structure of the present invention. It is obvious that this restriction on the coefficient space will effect the performance of the filter, and substantial research has been conducted to compensate for this limitation. The most promising approach was outlined in the cross-referenced application by Koo and Miron, which is the primary algorithm to be used by this structure. However, since this invention is a fully programmable filter, any power of two filter algorithm can be implemented.

FILTER ARCHITECTURE

Figure 2:
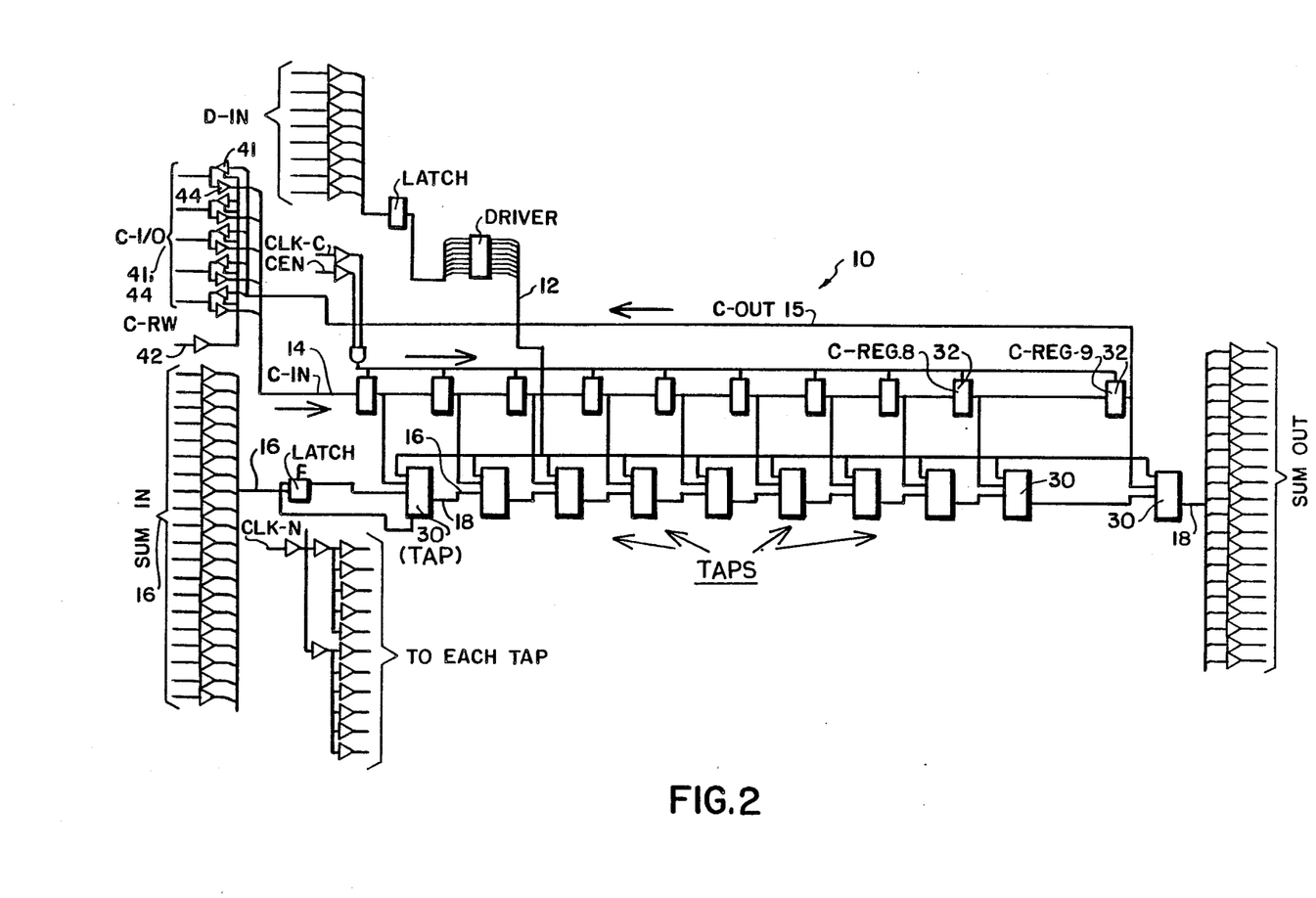
FIG. 2 is a circuit diagram of the filter of the present invention.

With reference to FIG. 2, we will describe the architecture of filter 10 of the invention hierarchically. For the example illustrated, the top level of the hierarchy shows a ten tap structure of the filter 10. Three busses go into each tap 30, the data bus 12, the coefficient bus 14 and the sum-in bus 16. Going out of each tap is the sum-out bus 18. The purpose and function of each bus will become clear in the discussion of the filter operation, but it is clear that the structure is extremely regular and modular. This is an extremely important feature in the architecture from the VLSI implementation point of view.

Referring to FIG. 2, the data bus 12 is the bus which brings the broadcast data sample D-IN to each tap 30. The coefficient bus 14 is a loop including the C-IN bus and the C-OUT bus 15, and originates at C-I/O gates 41, 44. It brings the weighting factor information and the sum-in bus 16 brings the delayed output of the previous tap 30. The sum-out bus 18 is the output of each tap 30 and can be fed into the sum-in input 16 of the next tap 30. Note that this architecture lends itself to cascading very naturally and easily, and is by no means limited to eleven taps only.

Figure 3:
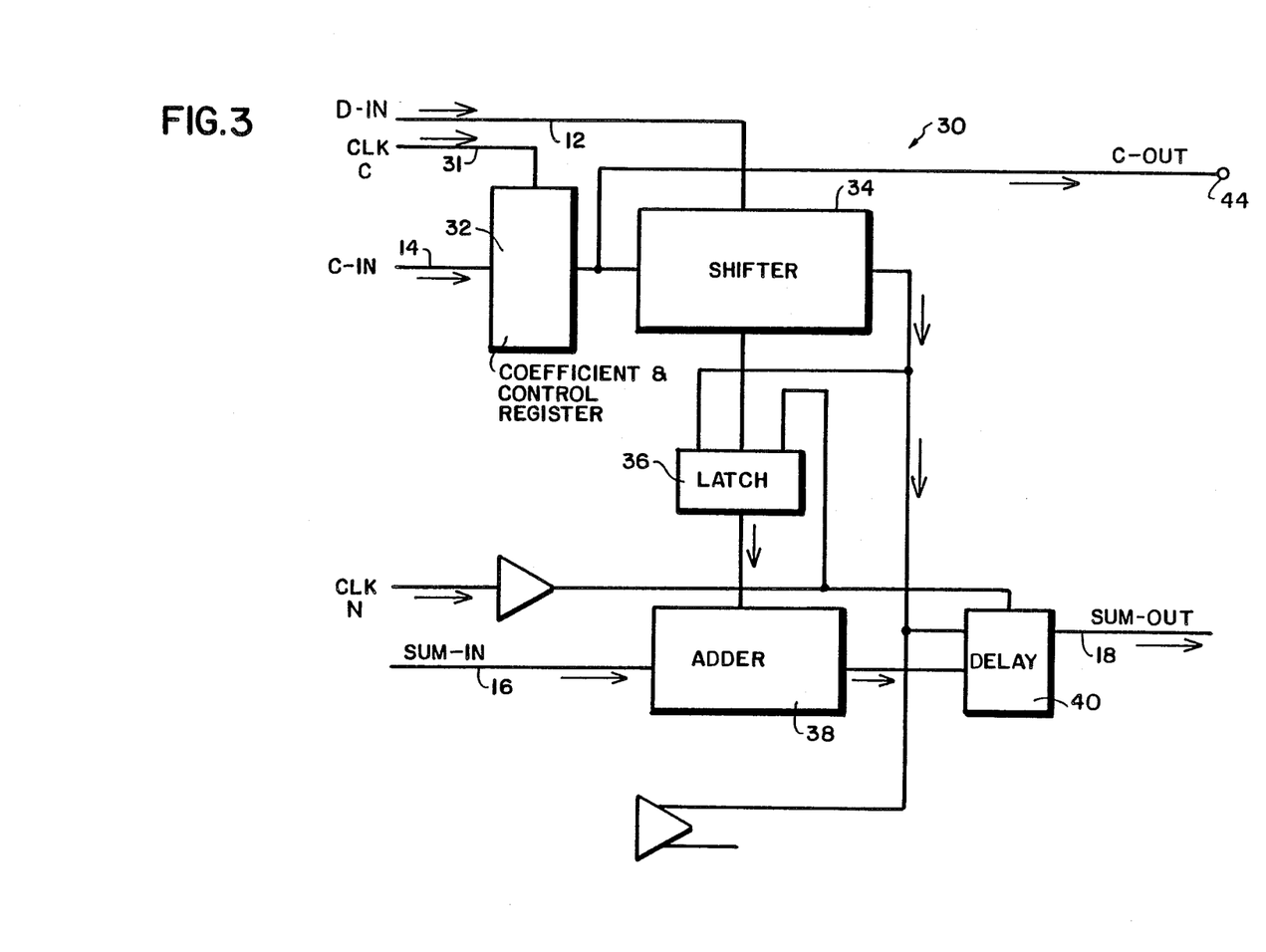
FIG. 3 is a circuit diagram of each tap of the filter of FIG. 2.

FIG. 3 shows the building blocks of each tap 30. They will each be explained in detail later, for now we will just identify them. The C-REG 32 is the register containing the coefficient and control word information CCW. This information is loaded in the initialization phase of the filter operation. Most of this information is used by the SHIFTER 34 for the correct power of two weighting. The output of the SHIFTER 34 is the weighted data sample, which is latched by a pipelining latch 36, used for speed enhancement purposes. The output of the latch 36 is added to the output of the previous tap by the ADDER 38, and the ADDER's output is finally delayed in DELAY 40 by one time unit of clock CLK-N before being passed on as the ADDER input of the next tap.

In the following section we will explain the coefficient/control word loading and non-destructive verification procedure, during the Initialization phase of the filter operation.

COEFFICIENT LOADING AND VERIFICATION

Filter 10 works in two phases: the initialization phase and the normal operation phase. The coefficients and control words (CCW) are loaded during the first phase. The C-REG 32 registers are connected to each other in a serial chain, hence the loading is serial. Consider the particular case of a ten tap filter. CCW #9 is applied to the coefficient input bus (C-IN) 14 of FIG. 2 and FIG. 3 and all the C-REG's are clocked by the clock CLK-C (discussed later). It is obvious that CCW #9 will be loaded in c-REG #0. Now CCW #8 is applied to the CI/O bus 14 and all the C-REG's are clocked again. This time CCW #9 shifts from C-REG #0 to C-REG #1 and CCW #8 loaded in C-REG #0. This procedure is repeated ten times. Each time a new CCW is applied to the CI/O bus 14 and all the C-REG's 32 are clocked, that particular CCW is loaded in C-REG #0 and all the other CCW's are shifted to the next C-REG 32 in the serial chain. At the end of the cycle (ten clock pulses in this case), all the CCW are loaded in the correct order in the C-REG's 32. Summarizing, the CCW furthest away from the CI/O bus 14 is loaded first; the next furthest away is next, and so on till all the CCW's have been loaded. Each new CCW pushes all the old CCW's one register over, and at the end of the cycle the loading is complete.

The next step is verification of the above loading. The purpose is to make sure all the CCW's have been loaded in their required destination registers. We utilize a non-destructive verification procedure by which the CCW's are read out of C-REG's 32 for verification and re-loaded in a closed loop back to the C-REG's 32 simultaneously, so at the end of the verification cycle the CCW's reside back at their respective C-REG's. To keep circuit simplicity and the I/O pins of the chip within limits, we choose not to use any CCW address schemes. Our verification procedure is also a serial procedure. In FIG. 2 the CI/O bus is a bidirectional bus, comprising C-IN bus 14 and C-OUT bus 15 the direction of which is controlled by an external signal on input 42 labeled C-RW. When the C-RW signal is set to 1, bus 14 acts as an input bus. Bus 15 acts as an output bus when C-RW is set to 0. It is obvious that for the CCW loading procedure, C-RW is set to 1 and the CCW's are loaded as discussed above. For verification, the C-RW signal is set to 0 and the CLK-C is clocked. At the first clock, the last coefficient (Coefficient #9) appears at the output (C-OUT) 44 (FIG. 3) and at the same time is loaded back in C-REG #0. The next clock cycle brings the next to last coefficient at the C-OUT bus and simultaneously loads it into C-REG #0 while pushing the current resident of C-REG #0 (coefficient #9) to C-REG #1. At the end of the verification cycle (ten clock pulses) all the coefficients have been read out from the C-OUT bus 15 through gates 41 and at the same time reloaded through gates 44 into the C-REG's 32 via C-IN bus 14.

POWER OF 2 MULTIPLIER AND ADDER

This filter uses only powers of two as coefficients. As binary multiplication by powers of two is nothing but a shift of the multiplicand, complex multiplication is replaced by a simple shifter 34 in this case. With the use of only negative powers of two as coefficients, the shift operation is simplified to only right shift. Assuming the data (multiplicand) has eight bits and is always positive, this multiplier can handle both positive and negative coefficients. Output of this multiplier is one's complement 16 bit data with the most significant bit (MSB) is sign bit and fifteen magnitude bits, hence keeping the provision of maximum seven bit shift for the eight bit multiplicand, which is equivalent to a multiplication by $2^{-7}$. This is the most negative power of two which this multiplier can handle and which the filter requires as well. Otherwise, properly programmed, it can multiply the multiplicand with any one of the following values $$0, \pm 2^{-0}, \pm 2^{-1}, \pm 2^{-2}, \ldots, \pm 2^{31\ 7}.$$

Figure 4A:
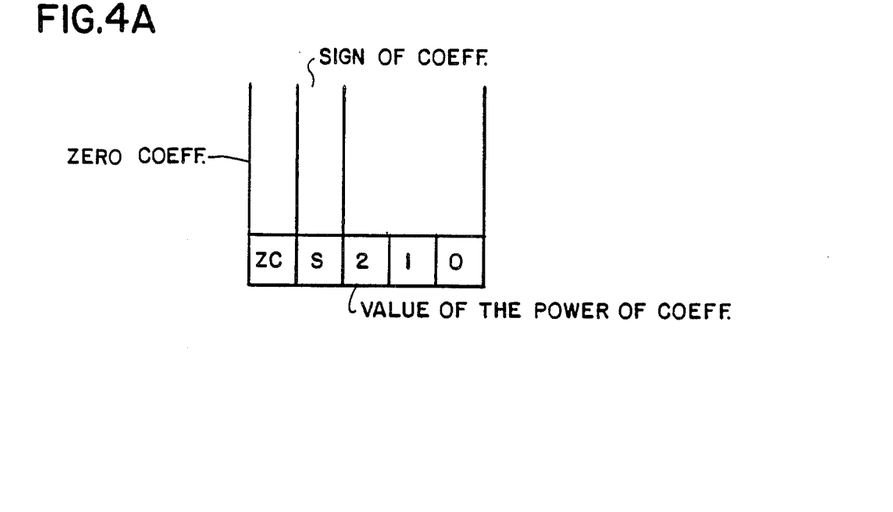
FIG. 4a is a diagram of the coefficient word for the filter of FIG. 2.
Figure 4B:
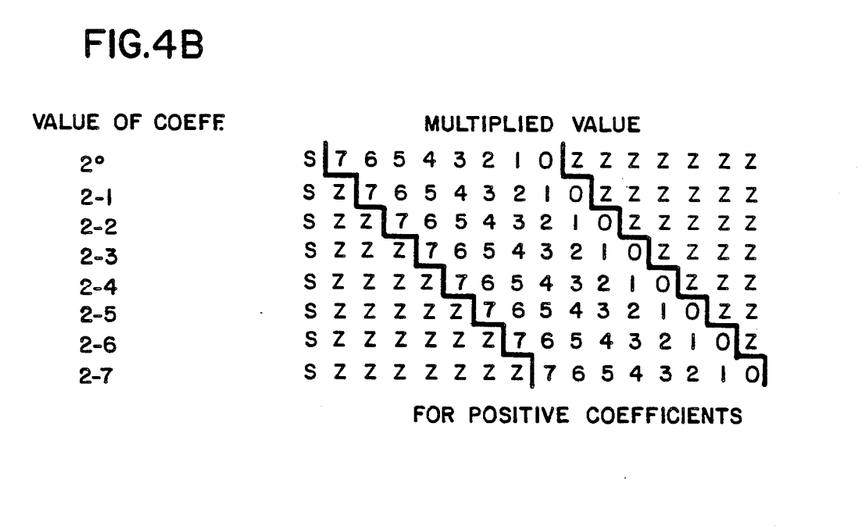
FIG. 4b shows the shifts of the multiplicand for positive coefficients of the filter of FIG. 2.

FIG. 4a shows the format of a control word (CCW) and FIG. 4b shows how the shift operation takes place for all positive values of coefficients.

Figure 5:
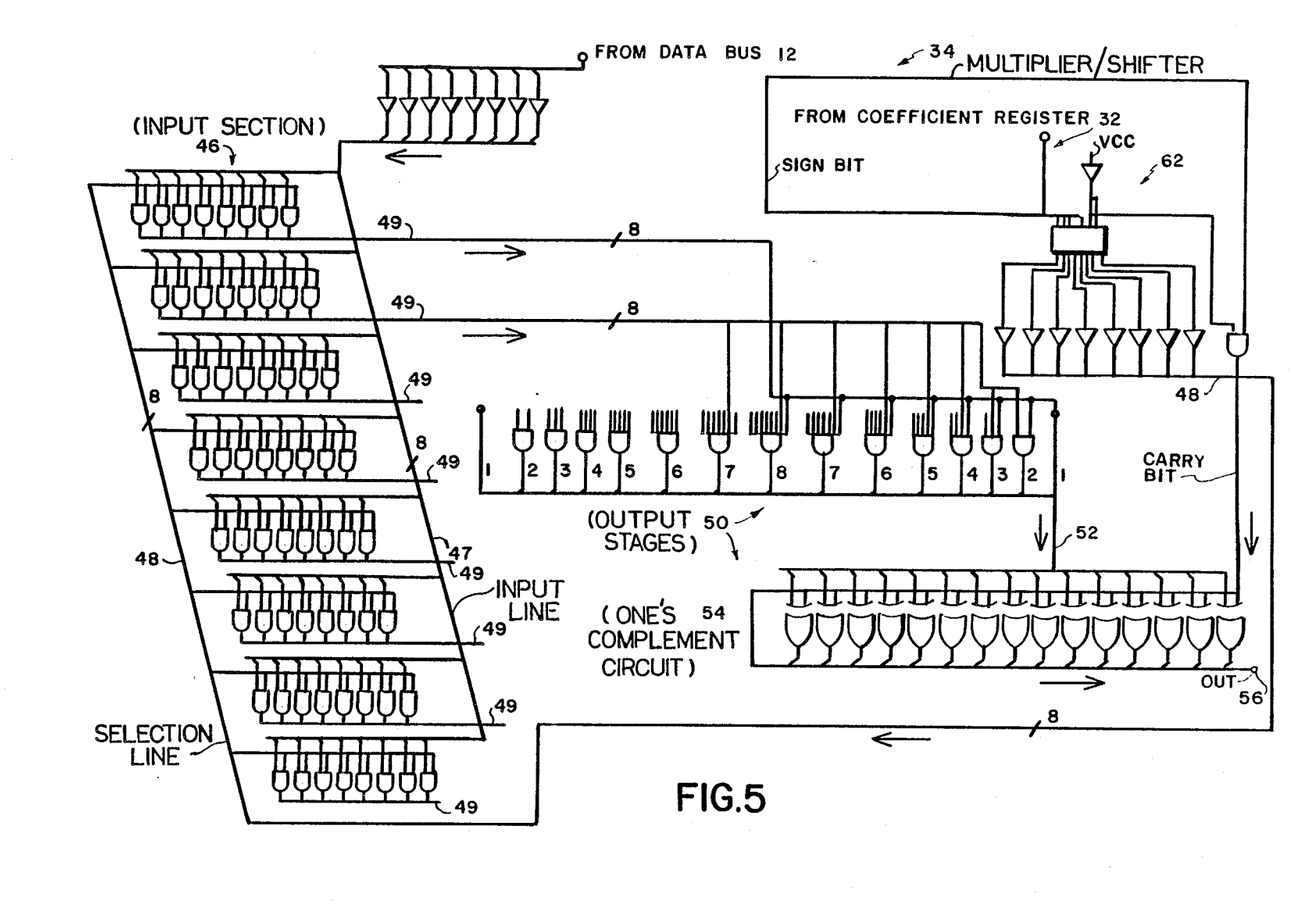
FIG. 5 is a logic diagram of the multiplier/shifter of the filter of FIG. 2.

FIG. 5 shows the logic diagram which implements the above mentioned one's complement multiplier/-shifter 34 operation. To maintain the programmability, in every stage of this multiplier we have incorporated all possible above shown shifts and that is done by a simple multiplexer whose input section 46 consists of eight sets of eight NAND gates. Each of the sets are fed by input lines 47 with the eight magnitude bits of the positive (thus not requiring any sign bit) multiplicand as shown in the left side of FIG. 5. Each set of NAND gates has a separate selection line 48. Which one of these sets of NAND gates 46 will be selected depends upon the value of the coefficient programmed for that stage in a C-REG 32. Outputs 49 of the selected set of NAND gates 46 are properly shifted and hardwired to the output stage 50 of the multiplier/shifter 34 to produce a fifteen bit magnitude AA bus 52 as shown in FIG. 5. Only the output lines of the first two sets of NAND gates 46 are shown. The final stage of this multiplier shifter circuit 34, the one's complement conversion logic circuit 54, which is a set of EX-OR gates, produces the bit by bit complement of AA bus 52, in case of negative coefficients. As the multiplicand is always positive, the sign of the multiplied output on bus 56 depends on that of the coefficient. This sixteen (fifteen bit magnitude together with sign bit) bit bus 56 is latched in latch 36 (FIG. 3) and delivered to the adder 38 (FIGS. 3 and 6).

Figure 6:
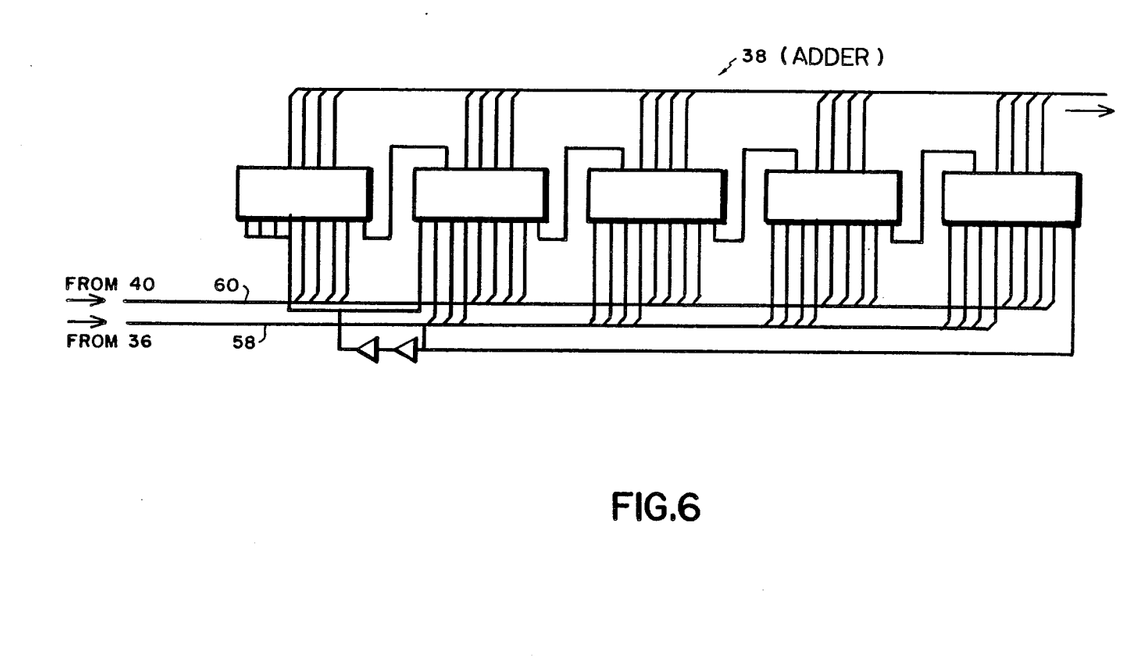
FIG. 6 is a circuit diagram of the adder of the filter of FIG. 2.

The section following the multiplier/shifter 34 and latch 36 is an adder 38 (FIG. 6). It is a partially (4 bit) full carry look ahead adder, cascaded to form a twenty bit adder. It receives the sixteen bit output of multiplier/shifter 34 via pipelining latch 36 as one of its inputs 58, and the other input 60 is the twenty bit latched output of delay 40 of the previous stage. The sign-extension technique is used for the smaller number in the adder. The sign of the smaller number which is in its one's complement form is also fed to the carry input of the adder and thereby converting the smaller number to its two's complement form. The following explanation determines the selection of the size (20 bits) of the bigger number. At a particular stage or tap this number is the accumulated result of multiplier outputs of all the stages up to that stage. So larger the number of stages, the larger the accumulated result (i.e., size) becomes. In the design of the chip, beside programmability, we incorporated its cascadibility as well. Experience shows that a maximum of sixteen taps for a filter with only power of two coefficients is a good choice to cover most of the video applications. Considering this fact the size (20 bits) is such that it will produce no overflow in the accumulated result of all sixteen stages after cascadation, even if each of the multipliers produces the largest possible output 7F80 (that takes place for largest possible eight bit multiplicand FF and the largest possible coefficient 1). To achieve this we need one sign bit, fifteen magnitude bits for each multiplied output and $\log_2 4$ its for sixteen ($2^4$) stage accumulation of them, which is 20 bits in total.

PROGRAMMING THE FILTER

As mentioned earlier, the FIR filter structure 10 is fully programmable for a coefficient space C such that:

$$[C\epsilon\{0, \pm 2^0, \pm 2^{-1}, \pm 2^{-2}, \ldots, \pm 2^{-7}\}]$$

The CCW contains the information of the actual shift, as well as the sign of the coefficient. It also contains information for a coefficient of magnitude 0. The Coefficient and Control Word CCW is a 5 bit word, 3 least significant bits, bits defining the power of the coefficient, the next bit controlling the sign and the most significant bit for zero coefficient. This is shown in FIG. 4a. The three coefficient power control bits pass through a decoder 62 (FIG. 3) and select one shift from $2^0$, $2^{-7}$, the sign control bit determines the sign of the coefficient. In case of zero coefficient (which is a special case since it is not a power of 2) bit number is set to 1.

The entire programming operation is elaborated in the example of Table 1. In the Table 1 the desired coefficient and its corresponding CCW code is shown. It is obvious the use of the decoder 62 enables us to reduce the number of I/O pins required for the CCW.

POSSIBLE EXTENSION OF THE COEFFICIENT SPACE

The power-of-two coefficient space can easily be extended beyond the current limit of $\pm 2^{-7}$ by modifying the shifter 34. For example, to increase the space to $\pm 2^{-15}$ requires one more bit for the coefficient value (from 3 to 4) and a 4-to-16 decoder. It also requires sixteen sets of 8 AND gates (instead of the currently used 8 sets). Thus, the overall architecture of the shifter 34 does not change; it is only extended to include the increase of coefficient space.

Similarly, filter 10 is not limited to a data word of eight bits. To increase this to any arbitrary size requires only an increase in the number of NAND gates per set from eight to what ever the data size desired is. Obviously, the ADDER 36 size (number of bits) will have to be increased or decreased according to the maximum value of both the coefficient space and data word size.

VLSI IMPLEMENTATION AND SIMULATION

This filter 10 was implemented using Signetics Corporation's 2 micron double metal standard cell technology. The current chip has ten taps. The IC lay out was performed using Silver Lisco's CAL-MP software. We will now present the simulation results of the various modes of operation of the chip.

INITIALIZATION PHASE

Figure 7:
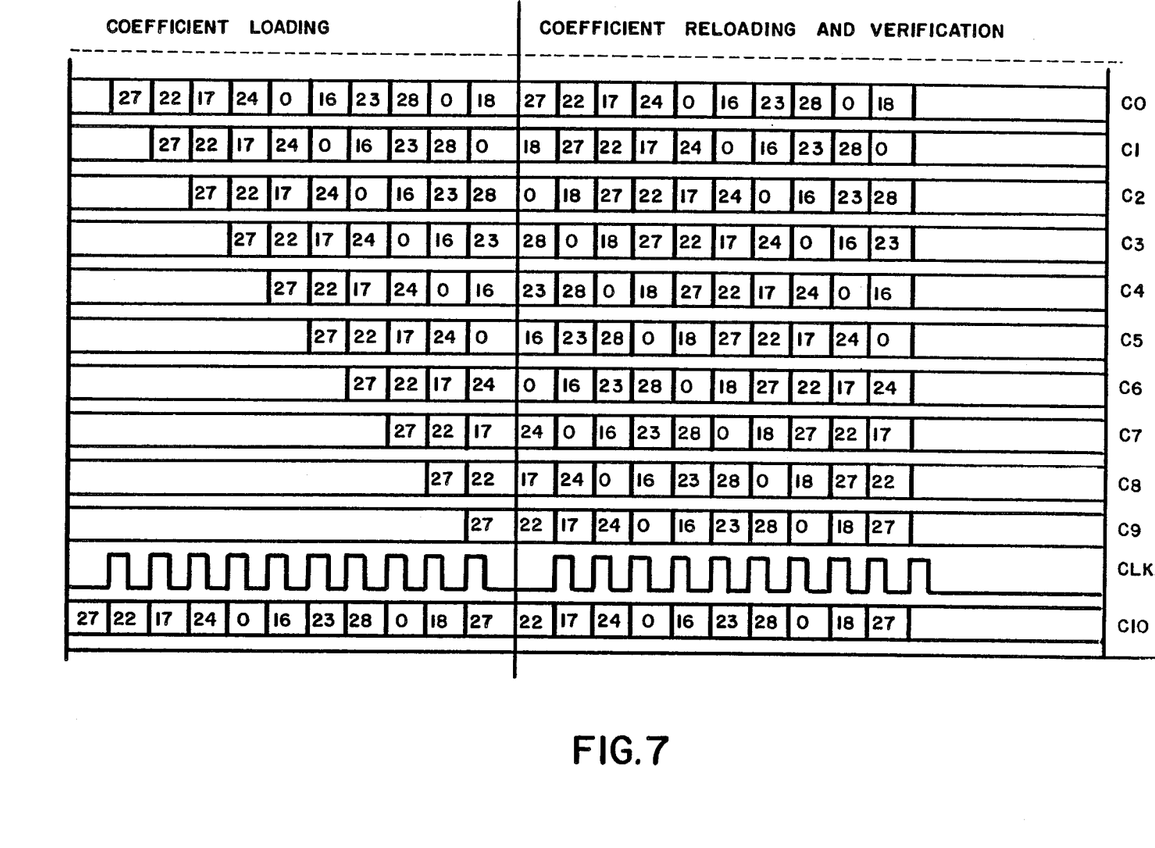
FIG. 7 is a diagram showing the sequence of coefficient loading and verification for the filter of FIG. 2.

Referring to the coefficient loading part of FIG. 7 and Table 2, we desire our filter coefficients to be as listed in Table 1. We presented them to the C-IN bus 14 in reverse fashion and at the end of ten clock pulses we can see that they are in the correct C-REG's 32. As mentioned earlier, for loading coefficients the C-RW 42 signal is set to 1.

Now for the verification of our loading the C-RW 42 signal is set to 0 and again supply ten coefficient clock pulses. The coefficient verification and reloading portion of FIG. 7 and Table 2 show that all of the coefficients appeared at the C-IN bus 14 (in reverse order) and are reloaded into the C-REG's 32. This concludes the simulation of our initialization procedure.

NORMAL OPERATION

For normal operation, the coefficient clock enable signal (CEN) is set to 1. Since, once initialization of the filter has been successfully accomplished, we do not want the coefficients to change, this signal is an added protection against a stray coefficient clock pulse (CLK-C) altering the coefficients. Data is presented via the D-IN bus 12 and the normal operation clock (CLK-N) now becomes the only system clock and filtering is performed on the data.

We have successfully simulated the filter using various coefficients and random data.

TABLE 1

| COEFFICIENT CONTROL WORD | BINARY VALUE | DECIMAL VALUE | DESIRED COEFFICIENT |
|---|---|---|---|
| C0 | 10010 | 18 | $2^{-2}$ |
| C1 | 00000 | 0 | 0 |
| C2 | 11100 | 28 | $-2^{-4}$ |
| C3 | 10111 | 23 | $2^{-7}$ |
| C4 | 10000 | 16 | $2^0$ |
| C5 | 00000 | 0 | 0 |
| C6 | 11000 | 24 | $-2^0$ |
| C7 | 10001 | 17 | $2^{-1}$ |
| C8 | 10110 | 22 | $2^{-6}$ |

TABLE 1-continued

| COEFFICIENT CONTROL WORD | BINARY VALUE | DECIMAL VALUE | DESIRED COEFFICIENT |
|---|---|---|---|
| C9 | 11011 | 27 | $-2^{-3}$ |

TABLE 2

| TIME | C0 | C1 | C2 | C3 | C4 | C5 | C6 | C7 | C8 | C9 |
|---|---|---|---|---|---|---|---|---|---|---|
| COEFFICIENT LOADING PROCEDURE | | | | | | | | | | |
| 0.0 | X | X | X | X | X | X | X | X | X | X |
| 100.0 | X | X | X | X | X | X | X | X | X | X |
| 200.0 | 27 | X | X | X | X | X | X | X | X | X |
| 300.0 | 22 | 27 | X | X | X | X | X | X | X | X |
| 400.0 | 17 | 22 | 27 | X | X | X | X | X | X | X |
| 500.0 | 24 | 17 | 22 | 27 | X | X | X | X | X | X |
| 600.0 | 0 | 24 | 17 | 22 | 27 | X | X | X | X | X |
| 700.0 | 16 | 0 | 24 | 17 | 22 | 27 | X | X | X | X |
| 800.0 | 23 | 16 | 0 | 24 | 17 | 22 | 27 | X | X | X |
| 900.0 | 28 | 23 | 16 | 0 | 24 | 17 | 22 | 27 | X | X |
| 1000.0 | 0 | 28 | 23 | 16 | 0 | 24 | 17 | 22 | 27 | X |
| 1100.0 | 18 | 0 | 28 | 23 | 16 | 0 | 24 | 17 | 22 | 27 |
| COEFFICIENT VARIFICATION AND RELOADING PROCEDURE. | | | | | | | | | | |
| 3300.0 | 18 | 0 | 28 | 23 | 16 | 0 | 24 | 17 | 22 | 27 |
| 3350.0 | 27 | 18 | 0 | 28 | 23 | 16 | 0 | 24 | 17 | 22 |
| 3450.0 | 22 | 27 | 18 | 0 | 28 | 23 | 16 | 0 | 24 | 17 |
| 3550.0 | 17 | 22 | 27 | 18 | 0 | 28 | 23 | 16 | 0 | 24 |
| 3650.0 | 24 | 17 | 22 | 27 | 18 | 0 | 28 | 23 | 16 | 0 |
| 3750.0 | 0 | 24 | 17 | 22 | 27 | 18 | 0 | 28 | 23 | 16 |
| 3850.0 | 16 | 0 | 24 | 17 | 22 | 27 | 18 | 0 | 28 | 23 |
| 3950.0 | 23 | 16 | 0 | 24 | 17 | 22 | 27 | 18 | 0 | 28 |
| 4050.0 | 28 | 23 | 16 | 0 | 24 | 17 | 22 | 27 | 18 | 0 |
| 4150.0 | 0 | 28 | 23 | 16 | 0 | 24 | 17 | 22 | 27 | 18 |
| 4250.0 | 18 | 0 | 28 | 23 | 16 | 0 | 24 | 17 | 22 | 27 |

We claim:

1. A non-recursive finite impulse response (FIR) digital filter of n taps, where $1 \leq n$, comprising:
   means to receive and store a plurality of coefficients, one coefficient per tap, wherein each coefficient is an integral power of 2;
   means to receive and shift a data input word in each of said taps, the extent of said shift being determined by the value of the coefficient stored in said tap;
   said shifted data word being equivalent to the product of said input data word and said coefficient of said tap;
   means to add said product at each tap to the delayed output of the previous tap to thereby form at each tap the cumulative sum of the products at all previous taps;
   means to delay and forward said cumulative sum to the next tap, and
   means to output the cumlative sum of all taps in said filter.

2. The filter of claim 1 wherein said means to receive and store a plurality of coefficients comprises:
   input means to load said coefficients into said filter in an initialization phase;
   a coefficient bus to transport each of said coefficients to a respective destination tap for each coefficient; and
   a coefficient register at each tap to store the coefficient for said tap.

3. The filter of claim 2 wherein:
   said coefficient bus is a serial bus;
   said coefficient registers are connected to each other in a serial chain; and
   said coefficients are loaded into said registers such that the coefficient for the last register in the chain is loaded first and each coefficient is shifted down said chain in inverse relationship to the proximity of such coefficient to the start of said chain.

4. The filter of claim 3 wherein said coefficient bus is a bidirectional bus, and further comprising:
   means to reverse the direction of serial bit flow on said coefficient bus;
   output terminal means on said coefficient bus; and
   means to verify the loading of said coefficients by reading said coefficients out serially to said output terminal means when said bus direction is reversed and reloading said coefficients in said destination taps.

5. The filter of claim 4 wherein said coefficient register stores a coefficient control word having five bits, three for the coefficient, one for its sign and one bit for a zero coefficient.

6. The filter of claim 4 further including a decoder to decode the output of said coefficient register.

7. The filter of claim 1 wherein said means to receive and shift said data input word comprises:
   a data bus connected to each of said taps, whereby said data input words are broadcast to each of said taps;
   a shifter in each tap in the form of a NAND-NAND multiplexer connected to said data bus and to said coefficient register of said tap, said shifter receiving each data word sequentially and shifting the bits thereof according to the coefficient stored in said coefficient register, the output of said shifter being weighted data sample.

8. The filter of claim 7 wherein said coefficients are only negative powers of two and said shifter shifts the bits of each data input word to the right only.

9. The filter of claim 1 where the coefficient space of said filter is limited to $0^{-7}$.

10. The filter of claim 9 further including:
    means to expand the filter length by cascading stages of said filter.

11. The filter of claim 1 wherein said filter is fully programmable.

12. The filter of claim 11 wherein said fully programmable filter includes means to provide up to a given number of shifts of the bits of said data input word.

13. The filter of claim 1 wherein said filter is limited to sixteen taps without any overflow.

14. The filter of claim 1 wherein said means to add said products comprises:
    a sum-in bus which transports the cumulative sum of previous weighted data samples to each tap;
    an adder to add the output of said shifter of each tap to the cumulative sum;
    a delay element;
    a sum-out bus which transports the sum of said adder to said delay element, said delay element connected to the sum-in bus of the next tap.

15. The filter of claim 14 wherein for an eight bit data word and a coefficient of $\pm 2^{-7}$ the output of said shifter is one sign bit and 15 magnitude bits in one's complement.

16. The filter of claim 14 wherein said shifter for an eight bit data word comprises:
    a shifter having an input section has eight sets of first NAND gates, each set receiving all eight bits of said data word;
    a selection line from said coefficient register to each of said sets of NAND gates, the coefficient register sending a selection signal over such selection lines which selects one of said sets of first NAND gates;

a second set of NAND gates to receive the output of the selected first set of NAND gates, the combination of the two sets of NAND gates providing the required shift as a shifter; and a set of EX-OR gates at the output of said shifter to perform one's complement conversion on the output of said shifter, which is latched for transfer to said adder.

* * * * *